(12) United States Patent
Liu et al.

(10) Patent No.: US 10,559,698 B2
(45) Date of Patent: Feb. 11, 2020

(54) OXIDE THIN FILM TRANSISTOR, MANUFACTURING METHOD THEREOF, ARRAY SUBSTRATE AND DISPLAY DEVICE

(71) Applicants: BOE TECHNOLOGY GROUP CO., LTD., Beijing (CN); FUZHOU BOE OPTOELECTRONICS TECHNOLOGY CO., LTD., Fuzhou, Fujian (CN)

(72) Inventors: Xiaowei Liu, Beijing (CN); Bo Liu, Beijing (CN); Yang Wang, Beijing (CN); Liangliang Li, Beijing (CN); Zheng Liu, Beijing (CN); Hongjiang Wu, Beijing (CN); Jianfeng Yuan, Beijing (CN)

(73) Assignees: BOE TECHNOLOGY GROUP CO., LTD., Beijing (CN); FUZHOU BOE OPTOELECTRONICS TECHNOLOGY CO., LTD., Fujian (CN)

( * ) Notice: Subject to any disclaimer, the term of this patent is extended or adjusted under 35 U.S.C. 154(b) by 0 days.

(21) Appl. No.: 15/995,706

(22) Filed: Jun. 1, 2018

(65) Prior Publication Data
US 2019/0097058 A1    Mar. 28, 2019

(30) Foreign Application Priority Data
Sep. 22, 2017    (CN) ............................ 2017 1 0867772

(51) Int. Cl.
*H01L 29/786*    (2006.01)
*H01L 27/12*    (2006.01)
(Continued)

(52) U.S. Cl.
CPC ...... *H01L 29/7869* (2013.01); *H01L 27/1225* (2013.01); *H01L 29/41733* (2013.01); *H01L 29/42384* (2013.01); *H01L 29/66969* (2013.01)

(58) Field of Classification Search
None
See application file for complete search history.

(56) References Cited

U.S. PATENT DOCUMENTS

2010/0279476 A1    11/2010    Arao
2016/0343863 A1*   11/2016    Chi .................... H01L 23/3171
2019/0109158 A1     4/2019    Kondo et al.

FOREIGN PATENT DOCUMENTS

CN    101814529 A    8/2010
CN    104617152 A    5/2015

OTHER PUBLICATIONS

The First Chinese Office Action dated Aug. 27, 2019; Appln. No. 201710867772.9.

* cited by examiner

*Primary Examiner* — Jack S Chen
(74) *Attorney, Agent, or Firm* — Ladas & Parry LLP; Hermine Valizadeh (57) ABSTRACT

Embodiments of the present application provide an Oxide TFT, a manufacturing method thereof, an array substrate and a display device. The Oxide TFT includes a base substrate; a gate electrode, a gate insulating layer and an active layer which are located on the base substrate; a source electrode and a drain electrode, the active layer is at least partly covered with the source electrode and the drain electrode; and a channel protection layer located between the source electrode and the drain electrode, each of the source electrode and the drain electrode includes at least part of a first metallic layer and at least part of a second metallic layer, the (Continued)

first metallic and the second metallic layer are stacked one on another, the channel protection layer is of a metal oxide.

10 Claims, 6 Drawing Sheets

(51) Int. Cl.
*H01L 29/66* (2006.01)
*H01L 29/423* (2006.01)
*H01L 29/417* (2006.01)

OXIDE THIN FILM TRANSISTOR, MANUFACTURING METHOD THEREOF, ARRAY SUBSTRATE AND DISPLAY DEVICE

The application claims priority of Chinese patent application No. 201710867772.9 filed with the SIPO on Sep. 22, 2017, the entire disclosure of which is incorporated herein by reference as part of the present application.

TECHNICAL FIELD

Embodiments of the present disclosure relate to an oxide thin film transistor, a manufacturing method thereof, an array substrate and a display device.

BACKGROUND

At present, Oxide thin film transistor (Oxide TFT) has been more and more applied in liquid crystal display (LCD) and organic light-emitting display (OLED) for its advantageous such as high mobility ratio, small off-state current, simple technology process, as well as low facility cost and manufacturing cost.

SUMMARY

At least one embodiment of the present disclosure provides an oxide thin film transistor (Oxide TFT), a manufacturing method thereof, an array substrate and a display device, which can prevent a channel of the Oxide TFT from being damaged while decreasing the number of patterning processes.

In order to achieve the objective above, the embodiments of the present disclosure adopt technical solutions as below.

From a first aspect, embodiments of the present disclosure provide an Oxide TFT, including a base substrate; a gate electrode, a gate insulating layer and an active layer that are located on the base substrate; a source electrode and a drain electrode, the active layer being at least partly covered with the source electrode and the drain electrode; and a channel protection layer located between the source electrode and the drain electrode, each of the source electrode and the drain electrode including at least part of a first metallic layer and at least part of a second metallic layer, the first metallic and the second metallic layer being stacked one on another, the channel protection layer being of an oxidation treatment.

In an example, the channel protection layer is a part of the first metallic layer which is between the source electrode and the second electrode and has been subjected to an oxidation treatment.

In an example, a material of the first metallic layer is aluminum (Al), and a material of the channel protection layer is an aluminum oxide compound.

In an example, a material of the second metallic layer is Copper (Cu).

In an example, the Oxide TFT further includes a barrier layer; the barrier layer is a part of the first metallic layer in the source electrode and a part of the first metallic layer in the drain electrode which have not been subjected to the oxidation treatment.

In an example, the Oxide TFT further includes a passivation layer; the source electrode, the drain electrode and the channel protection layer are covered with the passivation layer.

From a second aspect, embodiments of the present disclosure further provide an array substrate including the Oxide TFT mentioned above.

From a third aspect, embodiments of the present disclosure further provide a display device including the array substrate mentioned above.

From a fourth aspect, embodiments of the present disclosure further provide a manufacturing method of an Oxide TFT, including: providing a base substrate; sequentially forming a gate electrode, a gate insulating layer and an active layer on the base substrate; sequentially forming a first metallic layer and a second metallic layer on the active layer; performing a patterning process to the second metallic layer to form a source electrode and a drain electrode; and performing an oxidation treatment to a part of the first metallic layer located between the source electrode and the drain electrode, so as to form a channel protection layer, during the patterning process of forming the source electrode and the drain electrode.

In an example, a material of the first metallic layer is aluminum (Al), and a material of the channel protection layer is an aluminum oxide compound.

In an example, the performing a patterning process to the second metallic layer to form a source electrode and a drain electrode, and performing an oxidation treatment to a part of the first metallic layer located between the source electrode and the drain electrode to form a channel protection layer during the patterning process of forming the source electrode and the drain electrode includes: etching the second metallic layer by using an etchant to form the source electrode and the drain electrode, and performing the oxidation treatment to the part of the first metallic layer located between the source electrode and the drain electrode by using the etchant so as to form the channel protection layer.

In an example, the performing a patterning process to the second metallic layer to form a source electrode and a drain electrode, and performing an oxidation treatment to a part of the first metallic layer located between the source electrode and the drain electrode to form a channel protection layer during the patterning process of forming the source electrode and the drain electrode includes: performing the oxidation treatment to the part of the first metallic layer located between the source electrode and the drain electrode by using a thermal oxidation method so as to form the channel protection layer.

In an example, a material of the second metallic layer is Copper (Cu), and the etchant is hydrogen peroxide.

In an example, a material of the second metallic layer is Copper (Cu).

In an example, the manufacturing method further includes: upon forming the protection layer, forming a passivation layer on the source electrode, the drain electrode and the channel protection layer.

In an example, the manufacturing method further includes: forming a barrier layer by a part of the first metallic layer in the source electrode and a part of the second metallic layer in the drain electrode which are not subjected to the oxidation treatment, respectively.

BRIEF DESCRIPTION OF THE DRAWINGS

Hereafter, in order to clearly describe technical solutions of the embodiments in the present disclosure in a better way, the drawings of the embodiments will be briefly introduced. Obviously, the drawings to be described below merely relate to some embodiments of the present disclosure without any limitation to the present disclosure. In the drawings.

DETAILED DESCRIPTION

Hereafter, the technical solutions in the embodiments of the present disclosure will be clearly, completely described with reference to the drawings in the embodiments of the present disclosure. Obviously, the embodiments described are only a part of the embodiments, not all embodiments. Based on the embodiments in the present disclosure, all other embodiments obtained by one skilled in the art without paying inventive labor are within the protection scope of the present disclosure.

Unless otherwise defined, all the technical and scientific terms used herein have the same meanings as commonly understood by one of ordinary skill in the art to which the present invention belongs. The terms "first," "second," etc., which are used in the present disclosure, are not intended to indicate any sequence, amount or importance, but distinguish various components. The phrases "comprise(s)" and "include(s)" etc., refer to that, an element or an object preceding this phrase encompasses element(s) or object(s) listed following this phrase, and equivalents thereof, without excluding the existence of other element(s) or object(s). The phrases "connect", "connected", etc., are not intended to define a physical connection or mechanical connection, but may include an electrical connection, directly or indirectly.

Figure 1:
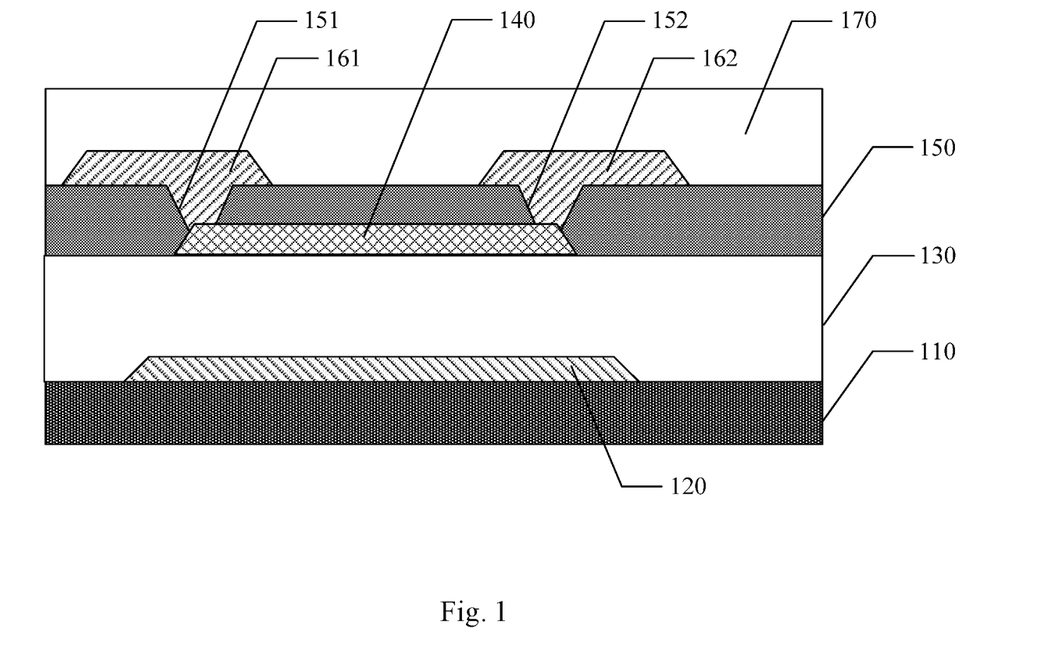
FIG. 1 is a schematic diagram illustrating a sectional structure of an ESL-typed Oxide TFT.
Figure 2:
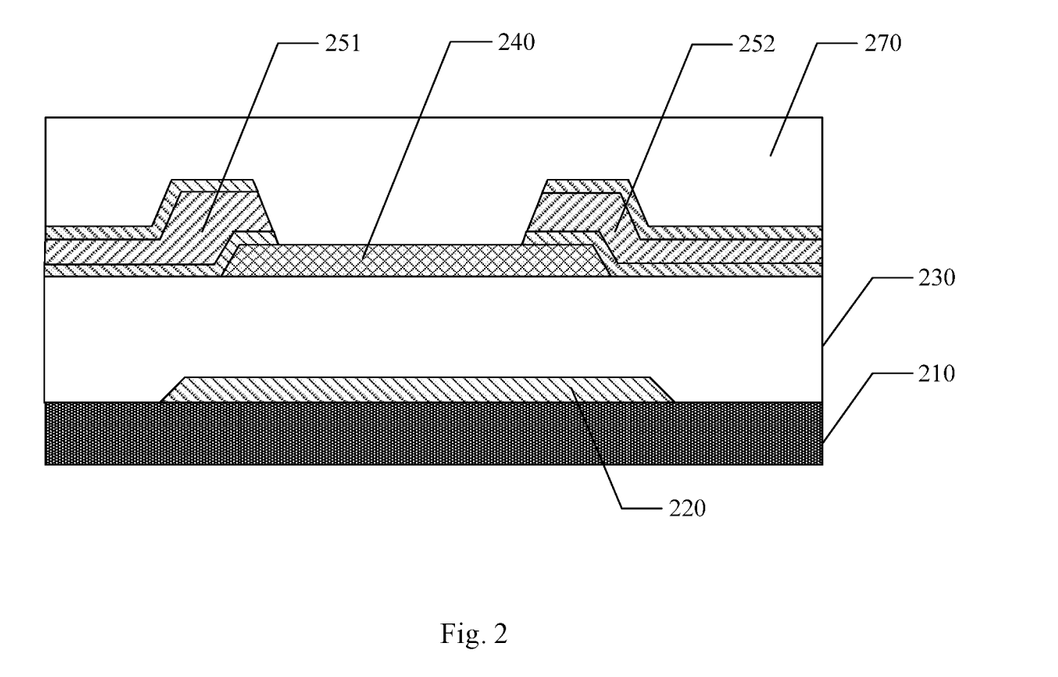
FIG. 2 is a schematic diagram illustrating a sectional structure of a BCE-typed Oxide TFT.

Generally, Oxide TFT can be classified into an etch stop layer (ESL) type and a back channel etch (BCE) type. FIG. 1 is a schematic diagram illustrating a sectional structure of an ESL-typed Oxide TFT, which includes a base substrate 110, a gate electrode 120, a gate insulating layer 130, a channel 140, a barrier layer 150, via holes 151, 152, a source electrode 161, a drain electrode 162 and a passivation layer 170. When etching the drain electrode and the source electrode of the ESL-typed Oxide TFT, the barrier layer 150 may function for protecting the channel 140 of the TFT. However, the ESL-typed Oxide TFT cannot be made in a smaller size and requires for one more patterning process as compared to the BCE-typed Oxide TFT because of an alignment issue of the via holes 151, 152. FIG. 2 is a schematic diagram illustrating a sectional structure of a BCE-typed Oxide TFT, which includes a base substrate 210, a gate electrode 220, a gate insulating layer 230, a channel 240, a source electrode 251, a drain electrode 252 and a passivation layer 260. The BCE-typed Oxide TFT, although having overcome the alignment issue, still involves the problem that the channel 240 is likely to be damaged during etching the source electrode and the drain electrode; that is, a material of forming the channel 240, for example, indium gallium zinc oxide (IGZO) may be damaged, which may result in a degradation of an electrical property of the BCE-typed Oxide TFT. Therefore, before forming the passivation layer 260, a $N_2O$ plasma treatment is required for the channel 240 to mitigate the damage subjected by the channel 240. However, the $N_2O$ plasma treatment would affect a property of metal Cu forming the source electrode and the drain electrode. For this reason, usually, the source electrode 251 and the drain electrode 252 of the BCE-typed Oxide TFT each have a tri-layered structure; that is, a top metallic layer is disposed to cover a top surface of a source-drain metallic layer, and an underlying metallic layer is disposed beneath a bottom of the source-drain metallic layer. For example, MoNb may be used as a metal material of forming the top metallic layer and the underlying metallic layer. However, these three metallic layers are different from each other in terms of an etching rate, which easily leads to problems such as eave and chamfer, thereby affecting the electrical property of the Oxide TFT.

Figure 3:
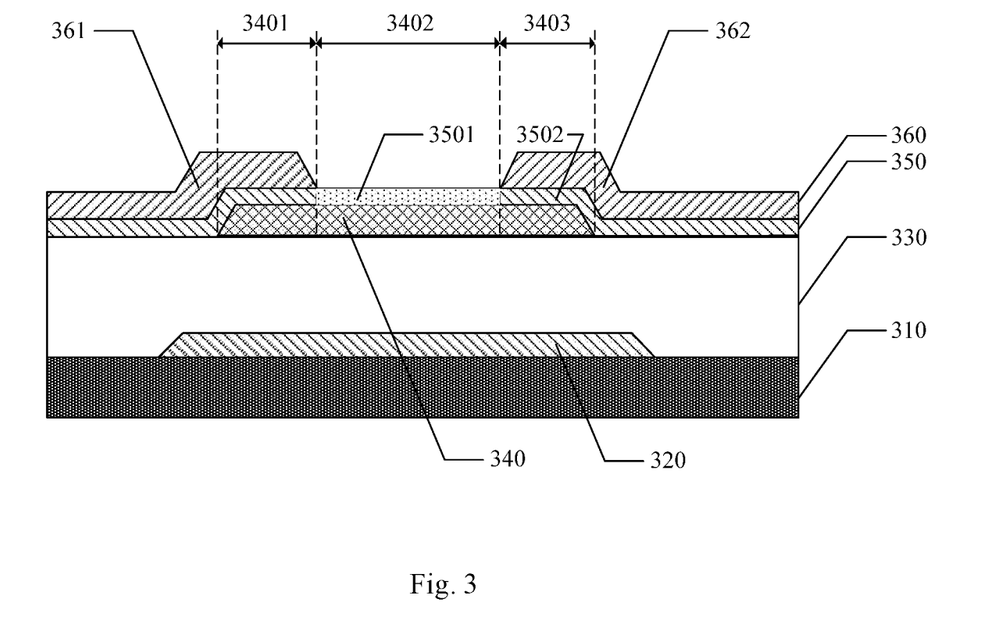
FIG. 3 is a schematic diagram illustrating a sectional structure of an Oxide TFT provided by an embodiment of the present disclosure.

Referring to FIG. 3, FIG. 3 is a schematic diagram illustrating a sectional structure of an Oxide TFT provided by an embodiment of the present disclosure. The Oxide TFT can be applied in the field of display technology, for example, a liquid crystal display panel or a semiconductor display device such as OLED display panel.

As illustrated in FIG. 3, the Oxide TFT provided by an embodiment of the present disclosure can include: a base substrate 310; and a gate electrode 320, a gate insulating layer 330 and an active layer 340 which are located on the base substrate 310. In an example, the Oxide TFT can further include a source electrode 361, a drain electrode 362 and a channel protection layer 3501 located between the source electrode 361 and the drain electrode 362, which are disposed to cover the active layer 340. Each of the source electrode 361 and the drain electrode 362 includes at least part of a first metallic layer 350 and at least part of a second metallic layer 360, the first metallic layer 350 and the second metallic layer 360 are stacked one on another; the channel protection layer 3501 is in a same layer with the first metallic layer 350 and is of a metal oxide.

In an example, the channel protection layer 3501 is formed by a metal oxidation treatment of a part of the first metallic layer 350 located between the source electrode 361 and the drain electrode 362.

In an example, still referring to FIG. 3, the active layer 340 includes a source region 3401, a drain region 3403 and a channel 3402 located between the source region 3401 and the drain region 3403. The channel protection layer 3501 covers a surface of the channel 3402; the source electrode 361 covers a surface of the source region 3401; the drain electrode 362 covers a surface of the drain region 3403; and the source electrode 361 and the drain electrode 362 are disposed at two sides of the channel 3402, respectively. The channel protection layer 3501 is a nonconductive oxidation layer, and is formed by performing an oxidation treatment to a metal in a region of the first metallic layer 350 corresponding to the channel 3402. A part of the first metallic layer 350 in the source electrode 361 that is not subjected to the oxidation treatment, and a part of the first metallic layer 350 in the drain electrode 362 that is not subjected to the oxidation treatment, can be used as a barrier layer 3502, so as to prevent metal ions in the second metallic layer from diffusing into the active layer. It should be explained that, the channel protection layer 3501 can be formed only by performing an oxidation treatment to a part of the first metallic layer 350 between the source electrode 361 and the drain electrode 362, without using a patterning process. For example, it's possible to directly perform an oxidation treatment to the part of the first metallic layer 350 corresponding to the channel 3402 by using an etchant with oxidizing effect during an etching process of forming the source electrode 361 and the drain electrode 362, so as to form the channel protection layer 3501. In practical application, it's also possible to perform an oxidation treatment to that part of the first metallic layer 350 by using a thermal oxidation method and the like.

It should be explained that, in practical application, when an oxide semiconductor such as IGZO is used to manufacture the active layer 340, the oxide may be reacted with hydrogen ions in substances in the air such as $H_2$ and $H_2O$ and hydrogen ions in the passivation layer due to properties of the oxide per se, which may consume oxygen ions in the oxide semiconductor and change a resistance value of the active layer 340 formed from the oxide semiconductor, thereby resulting in a drift of threshold voltage $V_{th}$. The drift of threshold voltage $V_{th}$ may directly influence an electrical property of the Oxide TFT. The channel protection layer 3501 formed by performing an oxidation treatment to the first metallic layer 350 can effectively prevent external hydrogen ions from damaging IGZO, so as to function for protecting the channel 3402. Moreover, a metal oxide formed by performing the oxidation treatment to the first metallic layer 350 is a compact, thin, oxide film with good insulating property, which can effectively avoid a short circuit between the source electrode 361 and the drain electrode 362 at the channel 3402.

It should be explained that, the source electrode and the drain electrode in the Oxide TFT are usually made from a metal Copper (Cu) which has strong diffusivity. If Cu ions in the source electrode 361 and in the drain electrode 362 are diffused into the active layer 340 made from oxide semiconductor, the resistance value of the active layer 340 will also be changed to result in the drift of threshold voltage $V_{th}$. By using the part of the first metallic layer 350 in the source electrode 361 not subjected to an oxidation and the part of the first metallic layer 350 in the drain electrode 362 not subjected to an oxidation as the barrier layer 3502, it can effectively prevent Cu ions from diffusing into the oxide semiconductor.

To sum up, in the Oxide TFT provided by the embodiment of the present disclosure, the channel protection layer 3501 can be formed to effectively protect the channel 3402, by simply performing an oxidation treatment to the part of the first metallic layer 350 corresponding to the channel, without using a patterning process to the first metallic layer 350. The technical solution is not only simple in technical process and low in cost but also effectively improves the electrical property of the Oxide TFT.

Figure 4:
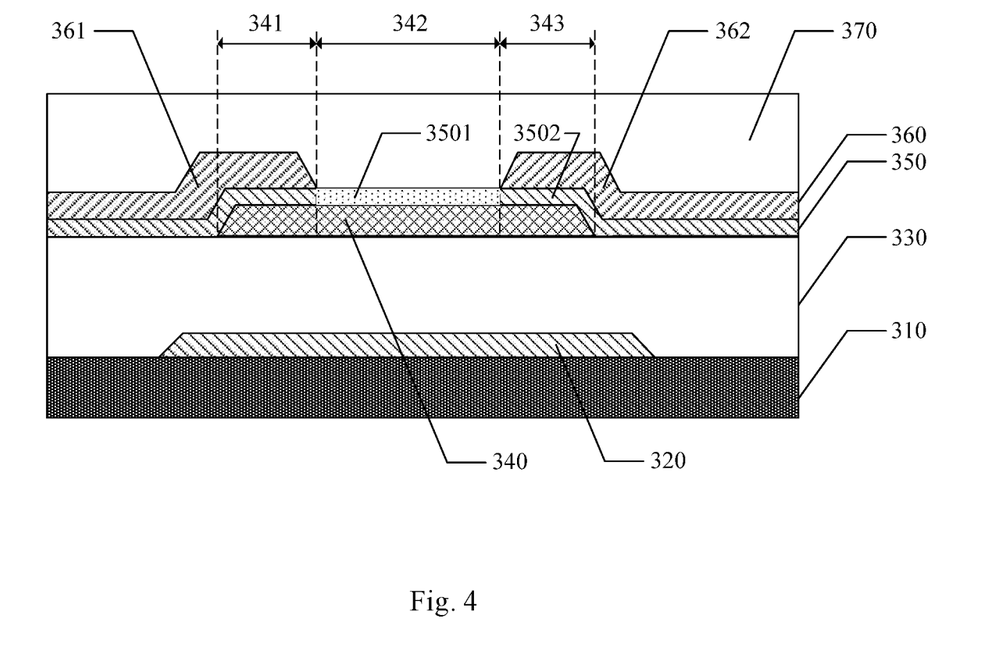
FIG. 4 is a schematic diagram illustrating a sectional structure of another Oxide TFT provided by an embodiment of the present disclosure.

Referring to FIG. 4, FIG. 4 is a schematic diagram illustrating a sectional structure of another Oxide TFT provided by an embodiment of the present disclosure. As can be seen from FIG. 4, the Oxide TFT provided by the embodiment of the present disclosure further includes a passivation layer 370. The passivation layer 370 covers a surface of the source electrode 361, a surface of the drain electrode 362 and a surface of the channel protection layer 3501. With a protection from the channel protection layer 3501, it can prevent the channel 3402 from being damaged by the hydrogen ions in the passivation layer 370, and can also prevent the channel 3402 from being damaged by the etchant used in the patterning process of forming the source electrode 361 and the drain electrode 362. As a result, it has no need of processing the IGZO by using $N_2O$ plasma before forming the passivation layer 370, and hence has no need of further disposing a top metallic layer covering the surface of the source electrode 361 and the drain electrode 362 to prevent the $N_2O$ plasma from corroding the source electrode 361 and the drain electrode 362. It should be explained that, processing IGZO by using $N_2O$ plasma refers to, by utilizing active oxygen ions in the $N_2O$ plasma, filling up a suspension bond formed in IGZO upon oxygen ions in the IGZO being consumed by reacting with hydrogen ions, so as to recover the electrical property of the IGZO used as a metal oxidation semiconductor. The $N_2O$ plasma has strong oxidizing property which may erode the source electrode 361 and the drain electrode 362. Thus. in the existing technology, usually, a top metallic layer made from a metallic material difficult to be oxidized, such as MoNb and Ti, is further disposed to cover the surface of the source electrode 361 and the drain electrode 362. As a comparison, the technical solution provided by the embodiment of the present disclosure eliminates the need of the top metallic layer.

In an example, a material of the first metallic layer 350 can be aluminum (Al) so that a material of the channel protection layer 3501 can be an aluminum oxide compound. Because a thin film made from an aluminum oxide compound such as $Al_2O_3$ has a great density, it can effectively prevent from a damage to the active layer 340 resulted by external hydrogen ions so as to function for protecting the channel 3402. Furthermore, at the same time when forming the aluminum oxide compound in a region corresponding to the channel 3402, an aluminum oxide compound will also be formed in a pixel region so that the channel protection layer 3501 can also function for protecting the pixel region more effectively, because a density of the aluminum oxide compound is greater than that of silicon oxide. It should be explained that, silicon oxide is a material of forming the gate insulating layer 330 in the Oxide TFT, and a thin film made from silicon oxide is usually located at a topmost layer of the gate insulating layer 330 to be in contact with the active layer 340 so as to prevent IGZO for forming the active layer 340 from being damaged by silicon nitride for forming the gate insulating layer 330.

In practical application, the channel protection layer 3501 can be formed by performing an oxidation treatment using an etchant, and the etchant can be, for example, the one used in the patterning process of forming the source electrode 361 and the drain electrode 362. For example, it's possible to achieve the oxidation of the part of the first metallic layer 350 corresponding to the channel 3402 by directly utilizing an etchant with oxidizing function such as hydrogen peroxide, which is used in the patterning process of forming the source electrode 361 and the drain electrode 362, during the patterning process of forming the source electrode 361 and the drain electrode 362. In this way, it has no need of additional oxidization treatment to form the channel protection layer 3501 after manufacturing the source electrode 361 and the drain electrode 362, which simplifies the technological processes and reduces the cost. In an example, a thickness of the first metallic layer 350 is smaller than a threshold thickness, so that the part of the first metallic layer 305 corresponding to the channel 3402 can be completely oxidized, thereby preventing the metallic material that is not oxidized from resulting in a short circuit of the channel 3402.

To sum up, in the Oxide TFT provided by the embodiment of the present disclosure, before forming the passivation layer 370, it has no need of processing the active layer 340 by using $N_2O$ plasma, and has no need of covering a top metallic layer on the surface of the source electrode 361 and the drain electrode 362, but only needs to perform an oxidation treatment to the part of the first metallic layer 350 corresponding to the channel, so as to form the channel protection layer 3501, for effectively protecting the channel 3402. In this way, as compared with ESL-typed Oxide TFT, the embodiment of the present disclosure reduces the number of patterning processes and eliminates a restriction to a size of the TFT resulted by alignment issues of via holes; and as compared with BCE-typed Oxide TFT, the embodiment of the present disclosure provides a channel protection layer 3501 to enhance a protection for the channel 3402, omits a top metallic layer, and eliminates the need of performing a patterning process to the first metallic layer 350, so as to considerably reduce the number of metallic layers to be etched, and hence to effectively avoid problems such as cave and chamfer resulted by inconsistent etching rates of multiple metallic layers. As a result, the Oxide TFT provided by the embodiment of the present disclosure not only can lower the cost by reducing the umber of patterning processes but also effectively improves the electrical property by providing an effective protection for the channel 3402 and by avoiding the problems such as eave and chamfer.

Figure 5:
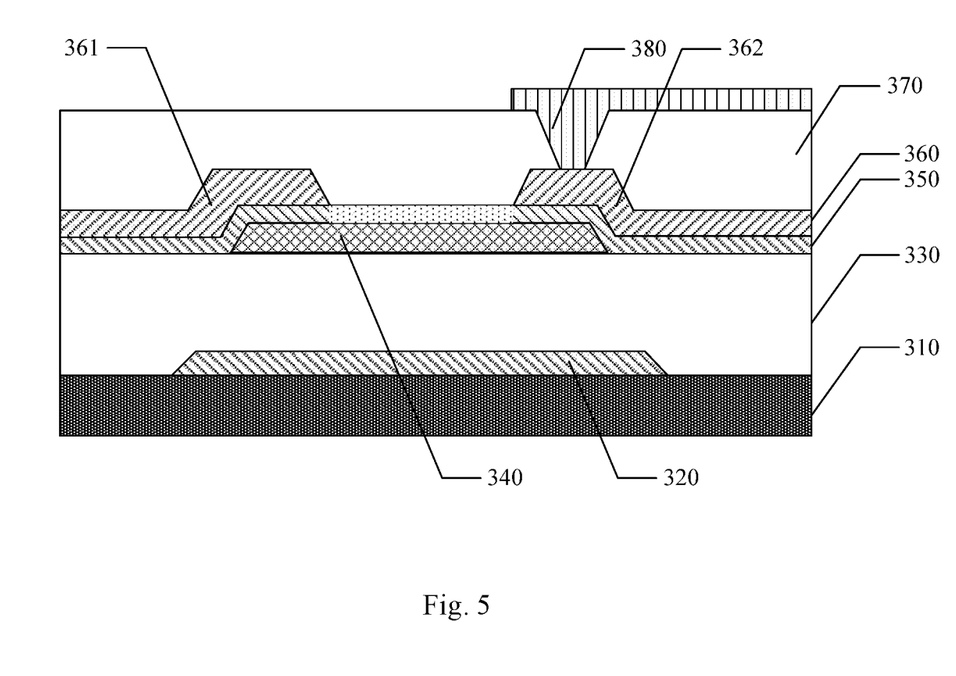
FIG. 5 is a schematic diagram illustrating a sectional structure of an array substrate provided by an embodiment of the present disclosure.

Based on the same inventive concept, referring to FIG. 5, the embodiment of the present disclosure further provides an array substrate including an Oxide TFT described in any of the preceding embodiments. Those skilled in the art should be appreciated that, the array substrate provided by the embodiment of the present disclosure further includes a pixel electrode 380 located on the passivation layer 370, the pixel electrode 380 is electrically connected to the drain electrode 362 through a via hole in the passivation layer 370. For example, a material of the pixel electrode 380 can be a transparent conductor including, but not limited to, Indium Tin Oxide (ITO) and Indium Zinc Oxide (IZO), without repeating herein.

Based on the same inventive concept, the embodiment of the present disclosure further provides a display device including an array substrate described in any of the preceding embodiments. For example, the display device provided by the embodiment of the present disclosure can be any product or component with display function such as liquid crystal panel, OLED display panel, digital paper, mobile phone, tablet computer, television, displayer, notebook computer, digital photo frame and navigator.

Figure 6:
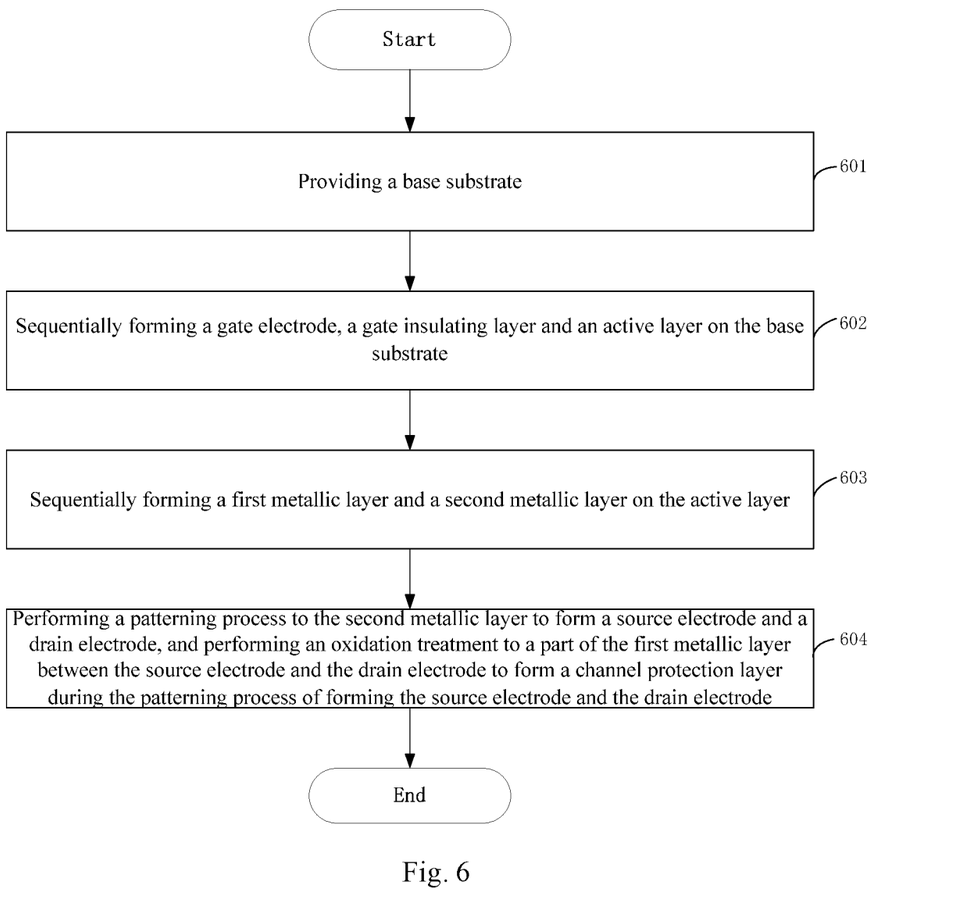
FIG. 6 is a flow chart of a manufacturing method of an Oxide TFT provided by an embodiment of the present disclosure.

Based on the same inventive concept, the embodiment of the present disclosure further provides a manufacturing method of an Oxide TFT. The manufacturing method can be applied to manufacture an Oxide TFT described in any of the preceding embodiments. Referring to FIG. 6, FIG. 6 is a flow chart of a manufacturing method of an Oxide TFT provided by an embodiment of the present disclosure. The illustrative manufacturing method includes steps described below.

Step S601, providing a base substrate 310.

For example, the base substrate 310 can be a glass substrate.

Step S602, sequentially forming a gate electrode 320, a gate insulating layer 330 and an active layer 340 on the base substrate 310.

For example, a metallic thin film can be formed on the base substrate 310, and a patterning process can be performed to the metallic thin film to form the gate electrode 320; then an insulating thin film can be formed on the base substrate 310 to cover the gate electrode 320, and used as the gate insulating layer 330; then a metal oxide semiconductor film can be formed on the gate insulating layer 330, and a patterning process can be performed to the metal oxide semiconductor film to form the active layer 340. The active layer 340 includes a source region, a drain region and a channel. The patterning process includes steps such as photoetching, etching and peeling, without repeating herein.

Step S603, sequentially forming a first metallic layer 350 and a second metallic layer 360 on the active layer 340.

For example, after forming the gate electrode 320, the gate insulating layer 330 and the active layer 340 on the base substrate 310, two metallic thin films can be sequentially formed on the active layer 340. These two metallic thin films include the first metallic layer 350 disposed closely adjacent to the active layer 340 and the second metallic layer 360 disposed far away from the active layer 340. For example, a material of the first metallic layer 350 can be aluminum (Al) or other metals which can be converted into a nonconductive dielectric film upon oxidization by using an etchant.

Step S604, performing a patterning process to the second metallic layer 360 to form a source electrode 361 and a drain electrode 362, and performing an oxidation treatment to a part of the first metallic layer 350 between the source electrode 361 and the drain electrode 362 to form a channel protection layer 3501 during the patterning process of forming the source electrode 361 and the drain electrode 362.

For example, during the patterning process of forming the source electrode 361 and the drain electrode 362, the second metallic layer 360 can be etched by using an etchant to form the source electrode 361 and the drain electrode 362, and the part of the first metallic layer 350 between the source electrode 361 and the drain electrode 362 can be subjected to an oxidation treatment by using this etchant so as to form the channel protection layer 3501.

In practical application, for example, a material of the first metallic layer 350 can be aluminum (Al), and a material of the channel protection layer 3501 correspondingly can be an aluminum oxide compound. A material of the second metallic layer 360 can be copper (Cu), and the etchant correspondingly can be the one with oxidizing effect such as hydrogen peroxide. That is to say, etching off Cu in the region corresponding to the channel by using hydrogen peroxide as the etchant, and then converting Al in this region into a nonconductive, aluminum oxide compound by utilizing the oxidizing effect of hydrogen peroxide, so as to form the channel protection layer 3501. For example, after forming the channel protection layer 3501, a passivation layer 370 instead of a top metallic layer can be directly formed on the surface of the source electrode 361, the surface of the drain electrode 362 and the surface of the channel protection layer 3501, so as to avoid problems such as eave and chamfer resulted by inconsistent etching rates among multiple metallic layers.

As another possible implementation, after forming the metal oxide semiconductor film on the gate insulating layer 330, for example, instead of forming the active layer 340 by a patterning process, the first metallic layer 350 and the second metallic layer 360 can be further formed on the metal oxide semiconductor film and then be patterned by using half toil mask (HTM) technology so as to form the active layer 340, the source electrode 361 and the drain electrode 362. It should be explained that, during forming the active layer 340, the source electrode 361 and the drain electrode 362 by using the HTM technology, a part of the first metallic layer 350 in the pixel region has to be removed along with that of the second metallic layer 360, and then a part of the first metallic layer 350 corresponding to the channel 3402 is subjected to an oxidation treatment. For example, the part of the first metallic layer 350 in the pixel region can be etched off by using an etchant of phosphoric acid, and then the part of the first metallic layer 350 corresponding to the channel 3402 can be converted into a nonconductive metal oxide by using an etchant such as hydrogen peroxide.

Referring to FIGS. 7-10, FIGS. 7-10 are schematic diagrams illustrating technological processes of manufacturing an Oxide TFT provided by an embodiment of the present disclosure.

Figure 7:
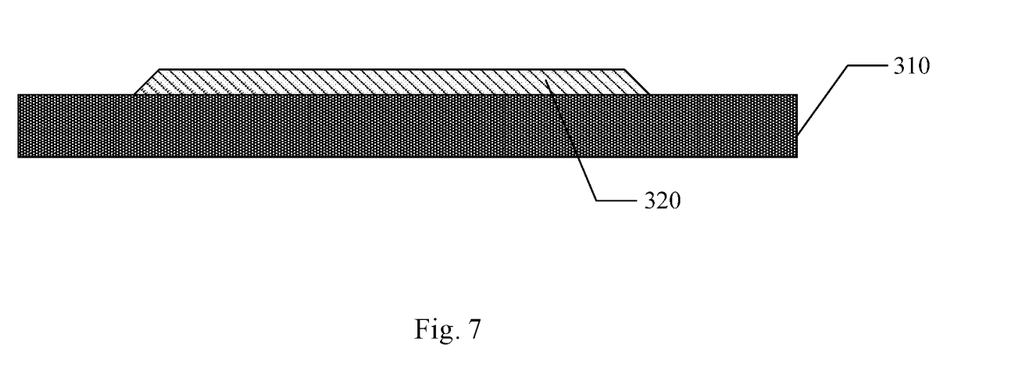
FIG. 7 is a schematic diagram illustrating a technological process of manufacturing an Oxide TFT provided by an embodiment of the present disclosure.
Figure 8:
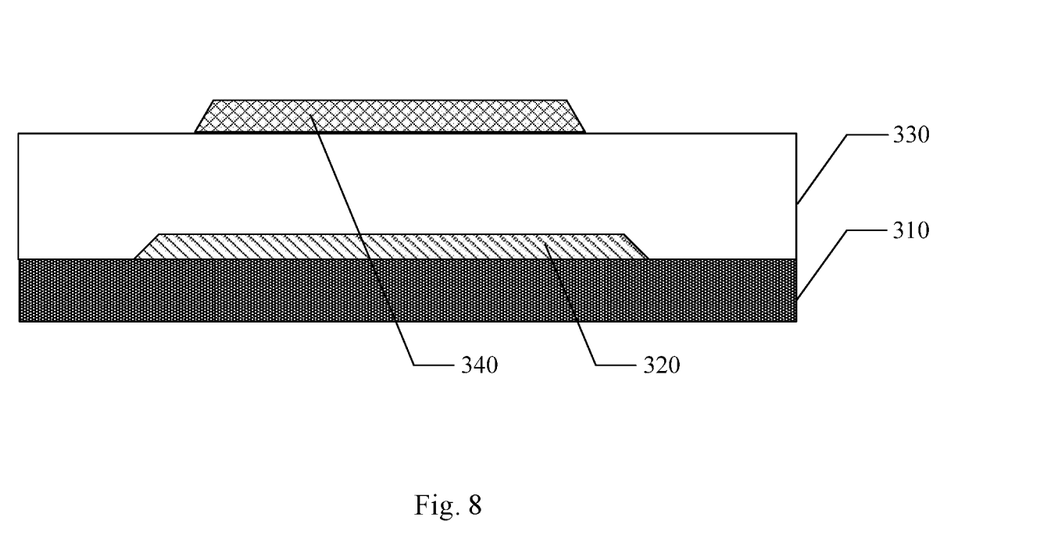
FIG. 8 is a schematic diagram illustrating another technological process of manufacturing an Oxide TFT provided by an embodiment of the present disclosure.
Figure 9:
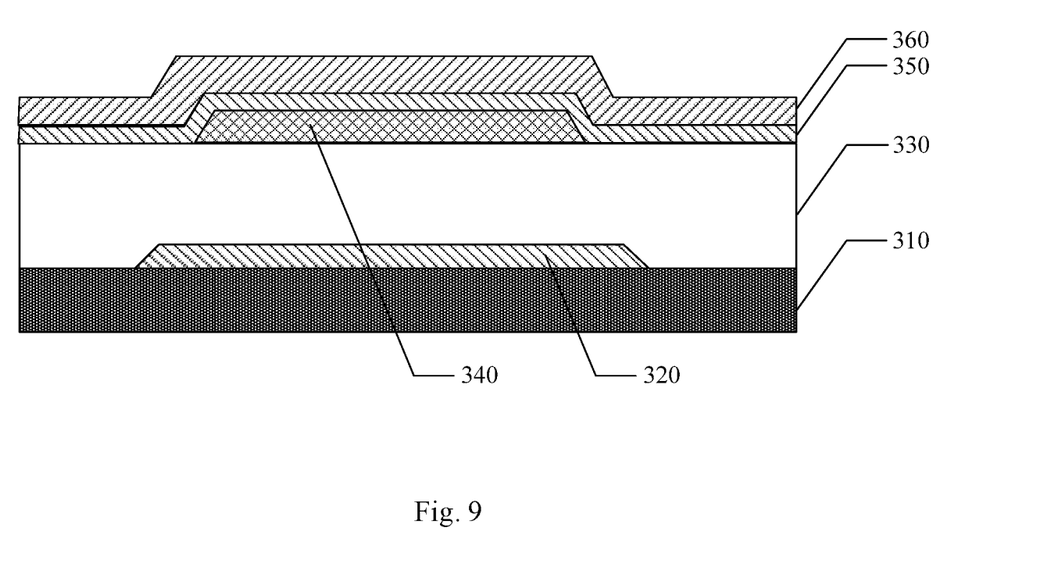
FIG. 9 is a schematic diagram illustrating yet another technological process of manufacturing an Oxide TFT provided by an embodiment of the present disclosure.
Figure 10:
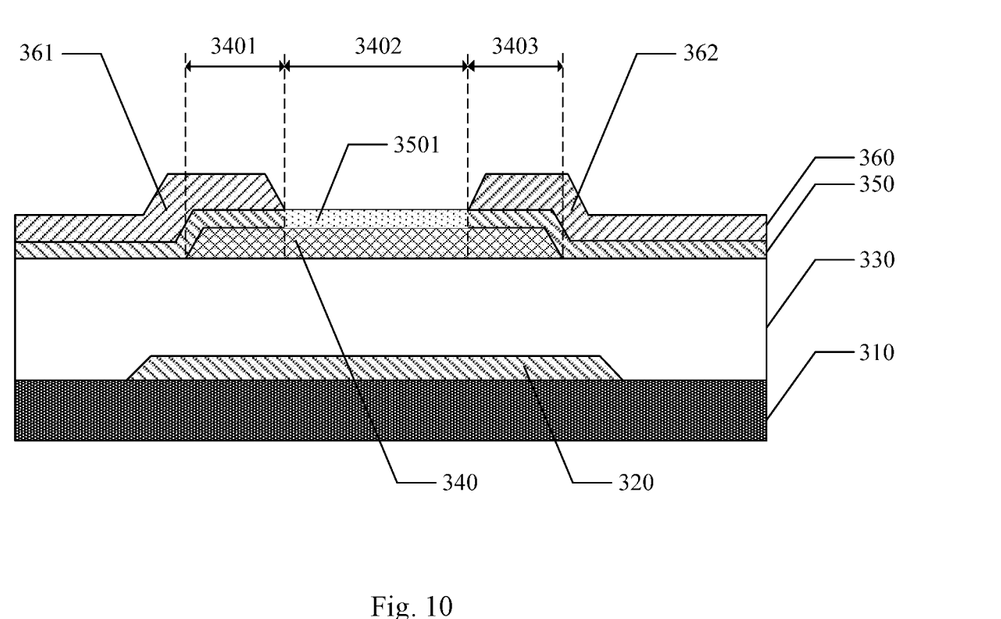
FIG. 10 is a schematic diagram illustrating further another technological process of manufacturing an Oxide TFT provided by an embodiment of the present disclosure.

As illustrated in FIG. 7, a metal Cu film can be formed on the base substrate 310, and a patterning process can be performed to the metal Cu film to form the gate electrode 320. As illustrated in FIG. 8, a silicon nitride film and a silicon oxide film are sequentially formed on a plane of the gate electrode 320 to form a gate insulating layer 330 covering an entire plane of the gate electrode 320; then a IGZO semiconductor layer is formed on the gate insulating layer 330, and a patterning process can be performed to the IGZO semiconductor layer to form the active layer 340. As illustrated in FIG. 9, a metal Al film and a metal Cu film are sequentially formed on the active layer 340; the metal Al film is used as the first metallic layer 350 to form the channel protection layer and an underlying metal of the source electrode 361 and the drain electrode 362; the metal Cu film is used as the second metallic layer 360 to form the source electrode 361 and the drain electrode 362. As illustrated in FIG. 10, by performing a patterning process to the metal Cu film (second metallic layer 360), the source electrode 361 and the drain electrode 362 are formed; during such patterning process of forming the source electrode 361 and the drain electrode 362, by using the etchant for etching the metal Cu film (second metallic layer 360), the part of the Al thin film (first metallic layer 350) corresponding to the channel 3402 is directly oxidized and converted into to an aluminum oxide compound so as to form the channel protection layer 3501.

To sum up, in the manufacturing method of the Oxide TFT provided by the embodiment of the present disclosure, by performing an oxidization treatment to the part of the first metallic layer 350 between the source electrode 361 and the drain electrode 362 during the patterning process of forming the source electrode 361 and the drain electrode 362, the channel protection layer 3501 for effectively protecting the channel 3402 can be formed with reduced number of patterning processes. In this way, as compared with ESL-typed Oxide TFT, the embodiment of the present disclosure reduces the number of patterning processes and eliminates a restriction to a size of the TFT resulted by alignment issues of via holes; as compared with BCE-typed Oxide TFT, the embodiment of the present disclosure provides a channel protection layer 3501 to enhance a protection for the channel 3402, omits a top metallic layer, and eliminates the need of performing a patterning process to the first metallic layer 350, so as to considerably reduce the number of metallic layers to be etched, and hence to effectively avoid problems such as cave and chamfer resulted by inconsistent etching rates among multiple metallic layers. As a result, the embodiment of the present disclosure not only can lower the cost by reducing the umber of patterning processes but also effectively improves the electrical property of the Oxide TFT by providing an effective protection for the channel 3402 and by avoiding the problems such as cave and chamfer.

The embodiments in the present disclosure are described progressively so that each of the embodiments focuses on distinction(s) over others, and identical or similar content(s) shared between different embodiments can be referred to each other.

The following statements should be noted:

(1) The accompanying drawings of the embodiments of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The foregoing are merely specific embodiments of the invention, but not limitative to the protection scope of the invention. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

What is claimed is:

1. An oxide thin film transistor (Oxide TFT), comprising:
a base substrate;
a gate electrode, a gate insulating layer and an active layer that are on the base substrate;
a source electrode and a drain electrode, the active layer being at least partly covered with the source electrode and the drain electrode; and
a channel protection layer between the source electrode and the drain electrode, each of the source electrode and the drain electrode comprising at least part of a first metallic layer and at least part of a second metallic layer, the first metallic and the second metallic layer being stacked one on another, wherein
a material of the second metallic layer is Copper (Cu),
a material of the first metallic layer is configured to be capable of being directly oxidized by an etchant of the second metallic layer, and
the channel protection layer is of a metal oxide of at least a part of the first metallic layer.

2. The Oxide TFT according to claim 1, wherein the channel protection layer is a part of the first metallic layer which is between the source electrode and the drain electrode and has been subjected to an oxidation treatment.

3. The Oxide TFT according to claim 1, wherein a material of the first metallic layer is aluminum (Al), and a material of the channel protection layer is an aluminum oxide compound.

4. The Oxide TFT according to claim 2, further comprising a barrier layer, wherein
the barrier layer is a part of the first metallic layer in the source electrode and a part of the first metallic layer in the drain electrode which have not been subjected to the oxidation treatment.

5. The Oxide TFT according to claim 1, further comprising a passivation layer, wherein
the source electrode, the drain electrode and the channel protection layer are covered with the passivation layer.

6. An array substrate, comprising an oxide thin film transistor (Oxide TFT), the Oxide TFT comprising:
a base substrate;
a gate electrode, a gate insulating layer and an active layer that are on the base substrate;

a source electrode and a drain electrode, the active layer being at least partly covered with the source electrode and the drain electrode; and a channel protection layer between the source electrode and the drain electrode, each of the source electrode and the drain electrode comprising at least part of a first metallic layer and at least part of a second metallic layer, the first metallic and the second metallic layer being stacked one on another, wherein a material of the second metallic layer is Copper (Cu), a material of the first metallic layer is configured to be capable of being directly oxidized by an etchant of the second metallic layer, and the channel protection layer is of a metal oxide of at least a part of the first metallic layer.

7. The array substrate according to claim 6, wherein the channel protection layer is a part of the first metallic layer which is between the source electrode and the drain electrode and has been subjected to an oxidation treatment.

8. The array substrate according to claim 6, wherein a material of the first metallic layer is aluminum (Al), and a material of the channel protection layer is an aluminum oxide compound.

9. The array substrate according to claim 7, further comprising a barrier layer, wherein the barrier layer is a part of the first metallic layer in the source electrode and a part of the first metallic layer in the drain electrode which have not been subjected to the oxidation treatment.

10. The array substrate according to claim 6, further comprising a passivation layer, wherein the source electrode, the drain electrode and the channel protection layer are covered with the passivation layer.

* * * * *